United States Patent
Wu et al.

(10) Patent No.: US 6,312,985 B1
(45) Date of Patent: Nov. 6, 2001

(54) METHOD OF FABRICATING A BOTTOM ELECTRODE

(75) Inventors: King-Lung Wu, Tainan Hsien; Tzung-Han Lee, Taipei, both of (TW)

(73) Assignee: United Microelectronics Corp., Hsinchu (TW)

(*) Notice: Subject to any disclaimer, the term of this patent is extended or adjusted under 35 U.S.C. 154(b) by 0 days.

(21) Appl. No.: 09/685,970

(22) Filed: Oct. 10, 2000

(51) Int. Cl.[7] ................................................. H01L 21/8242
(52) U.S. Cl. ........................... 438/253; 438/254; 438/255; 438/256; 438/396; 438/397; 438/398; 438/399
(58) Field of Search ..................................... 438/253–256, 438/396–399, 239–242, 393–395

(56) References Cited

U.S. PATENT DOCUMENTS

| | | | |
|---|---|---|---|
| 5,318,925 | * 6/1994 | Kim | 438/253 |
| 5,654,236 | * 8/1997 | Kasai | 438/639 |
| 6,020,236 | * 2/2000 | Lee et al. | 438/253 |
| 6,083,831 | * 7/2000 | Dennison | 438/666 |
| 6,130,128 | * 10/2000 | Lin | 438/253 |
| 6,165,839 | * 12/2000 | Lee et al. | 438/253 |
| 6,187,625 | * 2/2001 | Lin et al. | 438/253 |
| 6,232,176 | * 5/2001 | Parekh et al. | 438/255 |

* cited by examiner

Primary Examiner—John F. Niebling
Assistant Examiner—Jennifer M. Kennedy
(74) Attorney, Agent, or Firm—Thomas, Kayden, Horstemeyer & Risley

(57) ABSTRACT

A method of fabricating a bottom electrode is described. A first dielectric layer having a first opening is formed over a substrate. The first opening exposes a portion of a conductive layer in the substrate. A first liner layer is formed on a sidewall of the first opening. A conductive plug is formed in the opening. A plurality of bit lines are formed next to the first opening. A second liner layer is formed over the substrate to cover the bit lines, the first liner layer, and the conductive plug. A node contact opening is formed in the second liner layer to expose a portion of the conductive plug. A second dielectric layer is formed over the substrate. A second opening is formed in the second dielectric layer to expose the node contact opening and a portion of the second liner layer. A conformal conductive layer is formed in the opening.

20 Claims, 5 Drawing Sheets

METHOD OF FABRICATING A BOTTOM ELECTRODE

BACKGROUND OF THE INVENTION

1. Field of the Invention

The present invention relates to a semiconductor fabrication method. More particularly, the present invention relates to a method of fabricating a bottom electrode.

2. Description of the Related Art

As the integration of the semiconductor devices increases and the linewidth thereof decreases, it becomes desirable to form more semiconductor devices in a limited area. Due to limitations imposed by the fabrication process, it is difficult to achieve a highly integrated circuit. In addition, because difficulties exist in forming a highly integrated device, it is hard to ensure the reliability of the device. Therefore, how to fabricate highly integrated semiconductor devices has became the main topic of the recent research on semiconductor fabrication at the 0.13 micron level.

FIG. 1 is a schematic, cross-sectional view illustrating a conventional method of forming a bit line and a bottom electrode.

A metal oxide semiconductor (MOS) is formed on the substrate 100. The MOS includes a gate 102 on the substrate 100, a spacer 104 on the sidewall of the gate 102 and the source/drain region 106 in the substrate 100 beside the gate 102. A dielectric layer 108 is formed over the substrate 100 to cover the MOS. A bit line 110 is formed through the dielectric layer 108 to electrically couple with the source/drain region 106. A dielectric layer 112 is formed over the substrate 100 to cover the bit line 110. A bottom electrode 114 is formed through the dielectric layers 108 and 112 to electrically couple with the source/drain region 106.

In the conventional method, devices, such as bit line 110 and the bottom electrode 114 are separated from each other. Consequently, the integration of the semiconductor circuit cannot be effectively increased. Thus, there is a need to further increase the integration of semiconductor devices.

In addition, due to the fabrication limitation for forming semiconductor devices in a limited area, box-shaped capacitors are usually formed. However, the conventional box-shaped capacitor cannot provide sufficient capacitance. Thus, the capacitance of the conventional capacitor is limited.

SUMMARY OF THE INVENTION

The invention provides a method of fabricating a bottom electrode. A first dielectric layer having a first opening is formed over a substrate. The first opening exposes a portion of a conductive layer in the substrate. A first liner layer is formed on a sidewall of the first opening. A conductive plug is formed in the opening. A plurality of bit lines is formed next to the first opening. A second liner layer is formed over the substrate to cover the bit lines, the first liner layer, and the conductive plug. A node contact opening is formed in the second liner layer to expose a portion of the conductive plug. A second dielectric layer is formed over the substrate. A second opening is formed in the second dielectric layer to expose the node contact opening and a portion of the second liner layer. A conformal conductive layer is formed in the opening.

In contrast with the conventional method, which has devices separated from each other, the devices of the present invention are next and closer to each other. Thus, the integration of the semiconductor devices fabricated by the present invention is effectively increased. In addition, since the first liner layer and the second liner layer are used to isolate the bit lines from the bottom electrode, the reliability of the devices is enhanced.

In addition, because of the liner layers provide isolation between the bottom electrode and the bit line, the opening for forming the bottom electrode overlaps with the bit line when viewed from the top. Thus, the opening for forming the bottom electrode can be wider than the conductive plug. The surface area of the bottom electrode is thus further increased.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
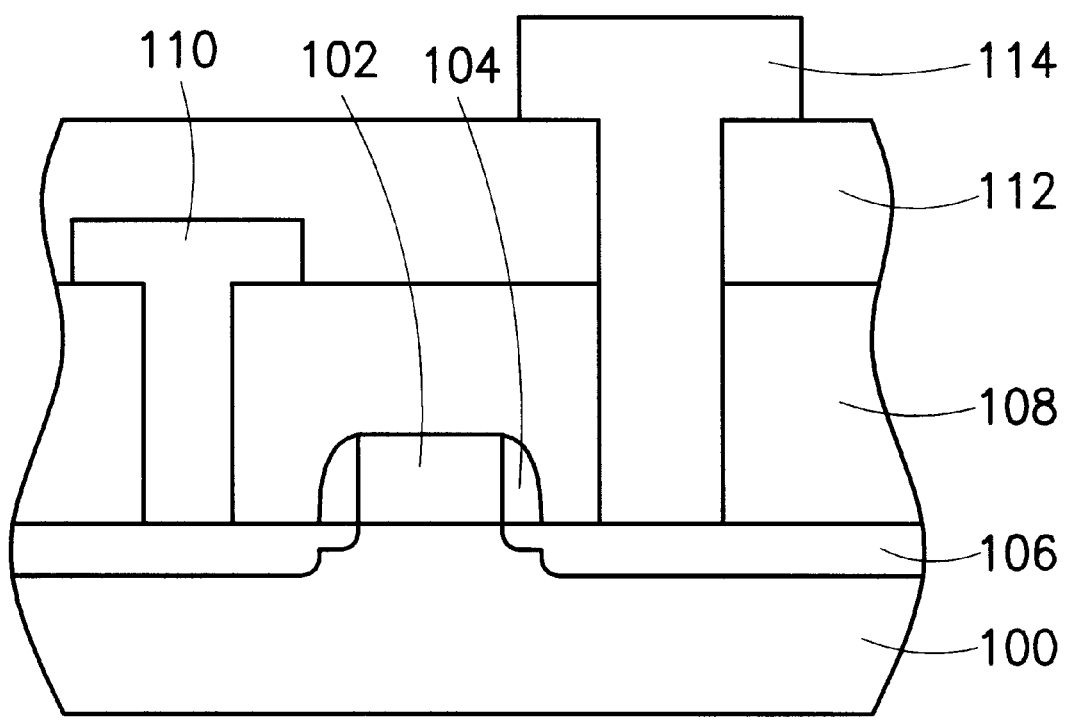
FIG. 1 is a schematic, cross-sectional view illustrating a conventional method of forming a bottom electrode and a bit line.

Reference will now be made in detail to the present preferred embodiments of the invention, examples of which are illustrated in the accompanying drawings. Wherever possible, the same reference numbers are used in the drawings and the description to refer to the same or like parts.

FIGS. 2A through 2E are schematic, cross-sectional views illustrating a method of fabricating a bottom electrode according to one preferred embodiment of the invention.

Figure 2A:
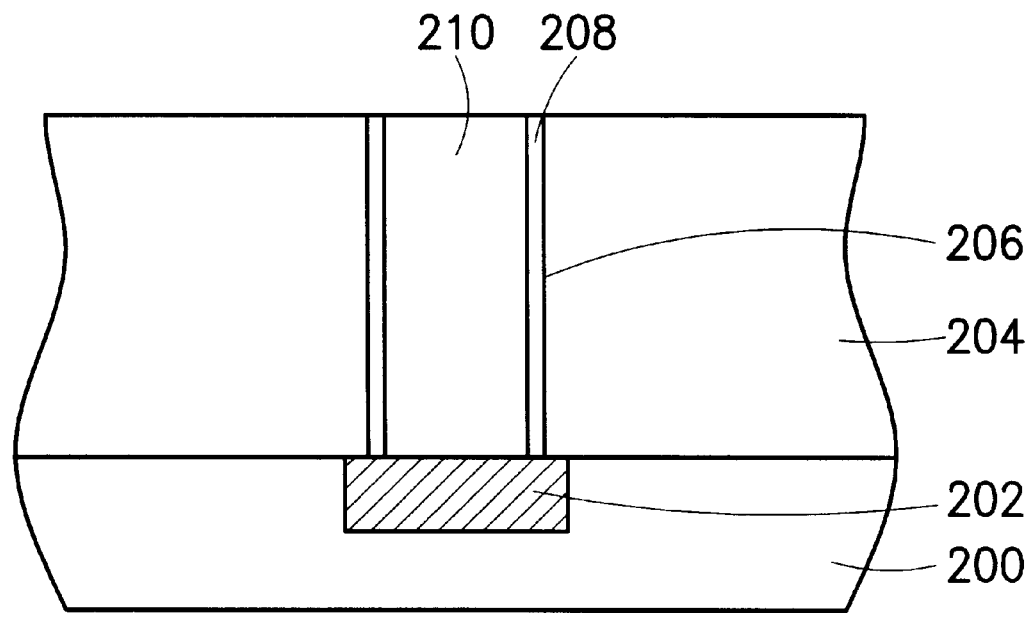
FIGS. 2A through 2E are schematic, cross-sectional views illustrating a method of fabricating a bottom electrode according to one preferred embodiment of the invention.

Referring to FIG. 2A, a substrate 200 having a conductive layer 202 therein is provided. The conductive layer 202 can be, for example, a source/drain region of a MOS or a conductive line. A dielectric layer 204 is formed over the substrate 200 by, for example, chemical vapor deposition. The material for the dielectric layer 204 includes oxide, tetra-ethyl-ortho-silicate (TEOS), borophosphosilicate glass (BPSG), or phosphosilicate glass (PSG). An opening 206 is formed in the dielectric layer 204 to expose a portion of the conductive layer 202. A liner layer 208 is formed on the sidewall of the opening 206. The thickness of the liner layer 208 is preferably about 100 angstroms to about 500 angstroms. A conductive plug 210 is formed in the opening 206. The liner layer 208 and the conductive plug 210 can be formed by the following exemplary steps. A conformal liner layer (not shown) is formed over the substrate 200 by, for example, plasma-enhanced chemical vapor deposition or deposition in a furnace. A photolithographic and etching process is performed to remove the conformal liner layer at the bottom of the opening 206. A conductive layer (not shown), such as polysilicon, is formed over the substrate 200 to fill the opening 206. A removing step, such as a chemical-mechanical polishing, is performed. The conductive layer and the conformal liner layer are removed until the dielectric layer 204 is exposed. The liner layer 208 and the conductive plug 210 as shown in the figure are thus formed.

Figure 2B:
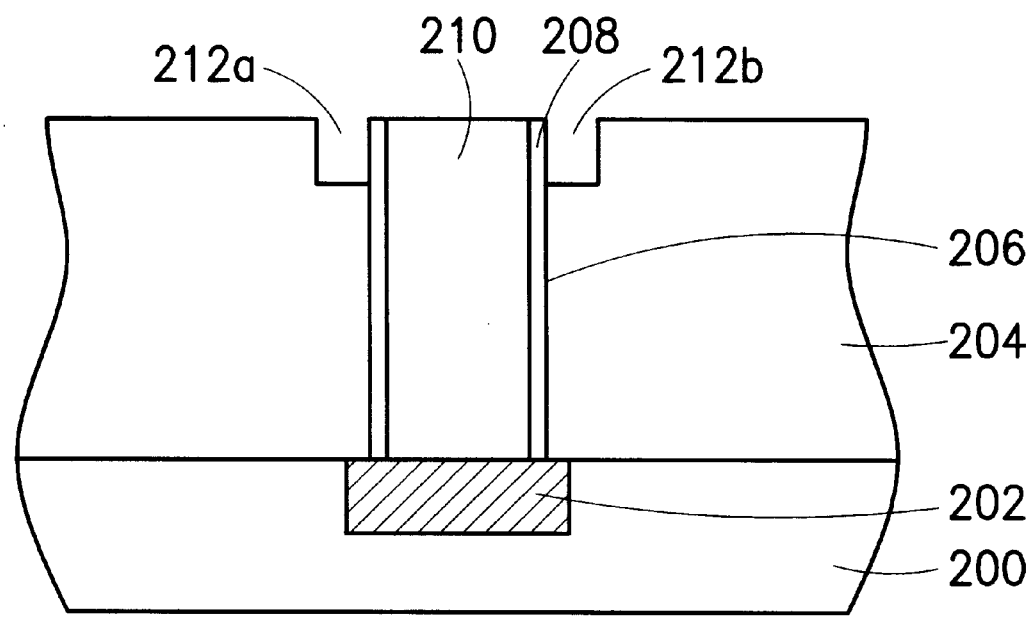

Referring to FIG. 2B, the dielectric layer 204 is patterned to form bit line openings 212a and 212b next to the opening 206. The bit line openings 212a and 212b exposes the liner layer 208. The dielectric layer 204 can be patterned by, for example, a photolithographic and etching process. In the photolithographic and etching process, the etchant has a high etching selectivity between the dielectric layer 204 and the liner layer 208. Specifically, the etching rate of the dielectric layer 204 is higher than the etching rate of the liner layer 208. For example, in the case that the material of the dielectric layer 204 is oxide, the liner layer 208 is a silicon nitride layer.

Figure 2C:
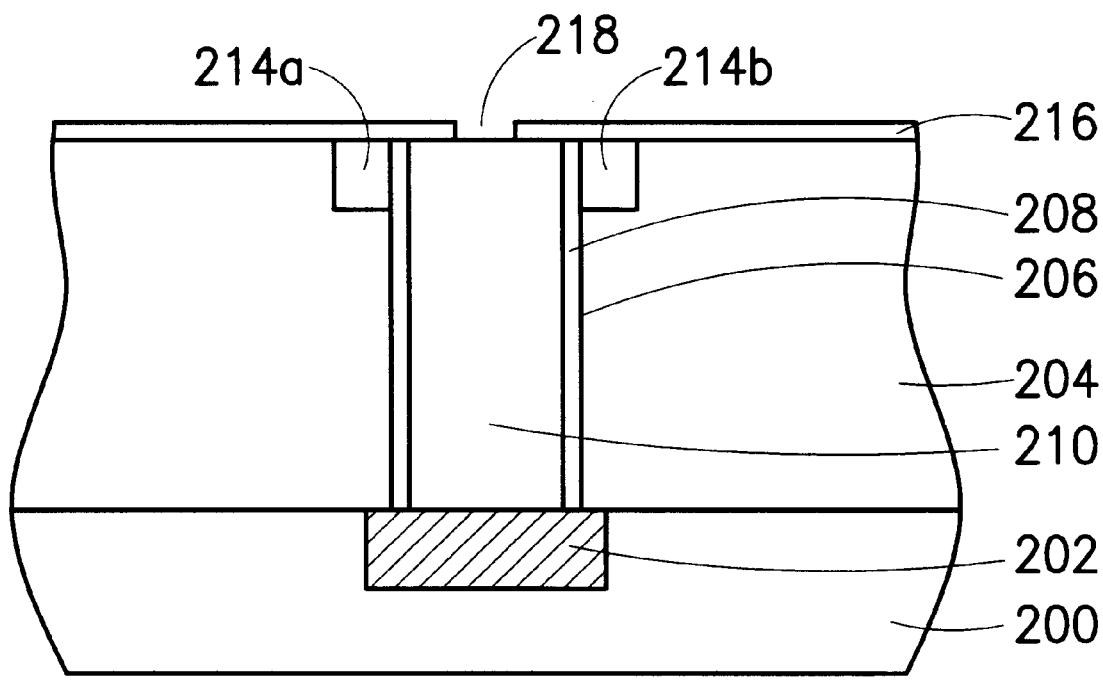

Referring to FIG. 2C, a metal material is filled in the bit line openings 212a and 212b to form bit lines 214a and 214b. The bit lines 214a and 214b can be formed by, for example, depositing a metal material over the substrate 200 to fill the bit line openings 212a and 212b followed by performing a chemical-mechanical polishing step to remove the metal material until the dielectric layer 204 is exposed. In this preferred embodiment, there are two bit lines 212a and 212b parallel to each other when viewed from the top. In addition, the metal material filling in the bit line openings 212a and 212b has a low resistance. Preferably, the metal material is tungsten, although other metal material having a low resistance can be used.

A liner layer 216 is formed over the substrate 200 to cover the bit lines 214a and 214b, the liner layer 208, and the conductive plug 210. The liner layer 216 preferably has a thickness of about 100 angstroms to about 500 angstroms and is formed by, for example, plasma-enhanced chemical-vapor deposition or deposition in a furnace. A node contact opening 218 is formed in the liner layer 216 to expose a portion of the conductive plug 210. The material of the liner layer 216 can be, for example, silicon nitride.

Figure 2D:
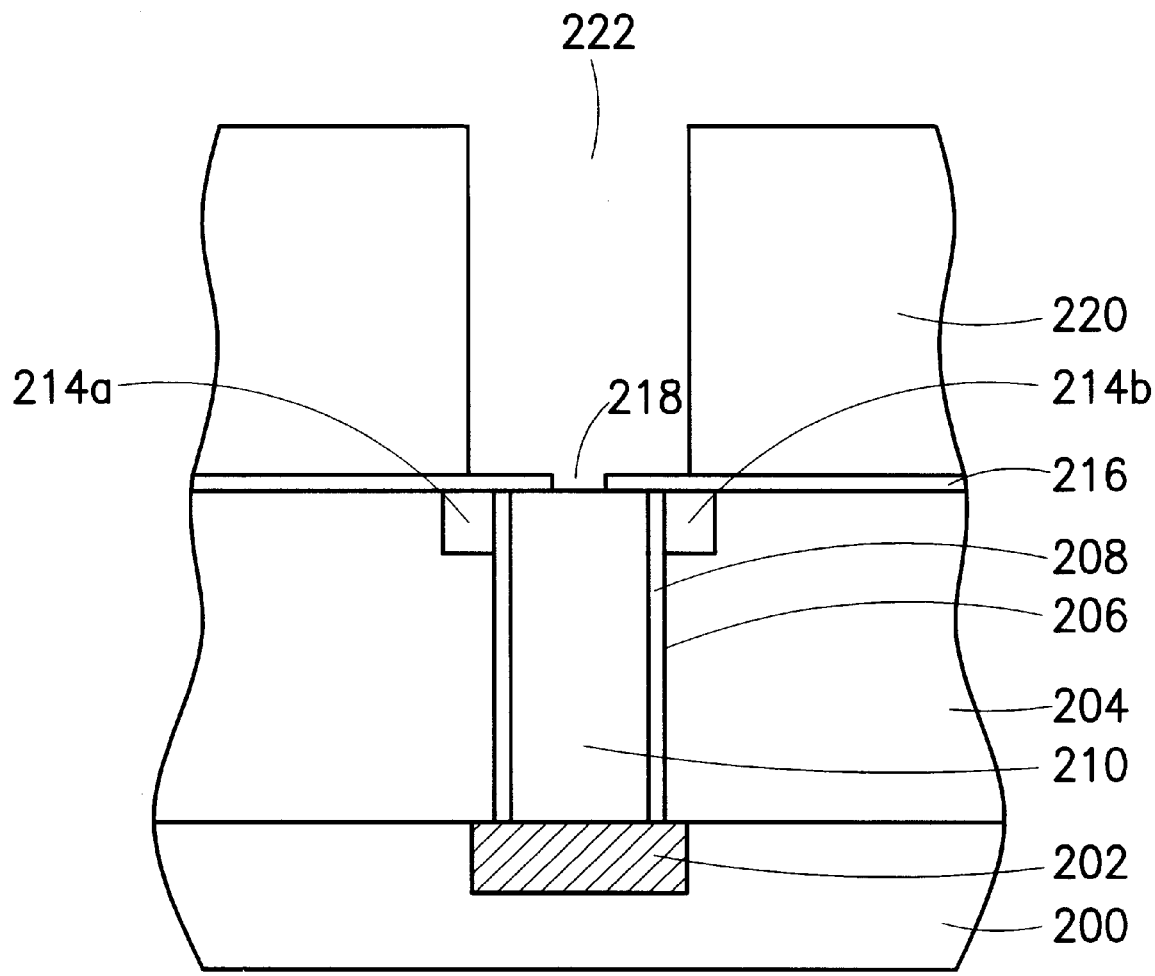

Referring to FIG. 2D, a dielectric layer 220 is formed over the substrate 200 by, for example, chemical vapor deposition. The dielectric layer 220 preferably has a thickness of about 8000 angstroms to about 10000 angstroms. The dielectric layer 220 includes an oxide layer, a tetra-ethyl-ortho-silicate (TEOS) layer, a borophosphosilicate glass (BPSG) layer, or a phosphosilicate glass (PSG) layer. An opening 222 is formed in the dielectric layer 220 to align with the conductive plug 210. The opening 222 exposes the node contact opening 218 and a portion of the liner layer 214. The opening 222 can be formed by, for example, a photolithographic and etching process. The etchant of the photolithographic and etching process has a high etching selectivity between the liner layer 216 and the dielectric layer 220. In this manner, the etching step is performed using the liner layer 214 as an etching stop. For example, in the case that the material of the dielectric layer 220 is oxide, the liner layer 214 is a silicon nitride layer.

Figure 2E:
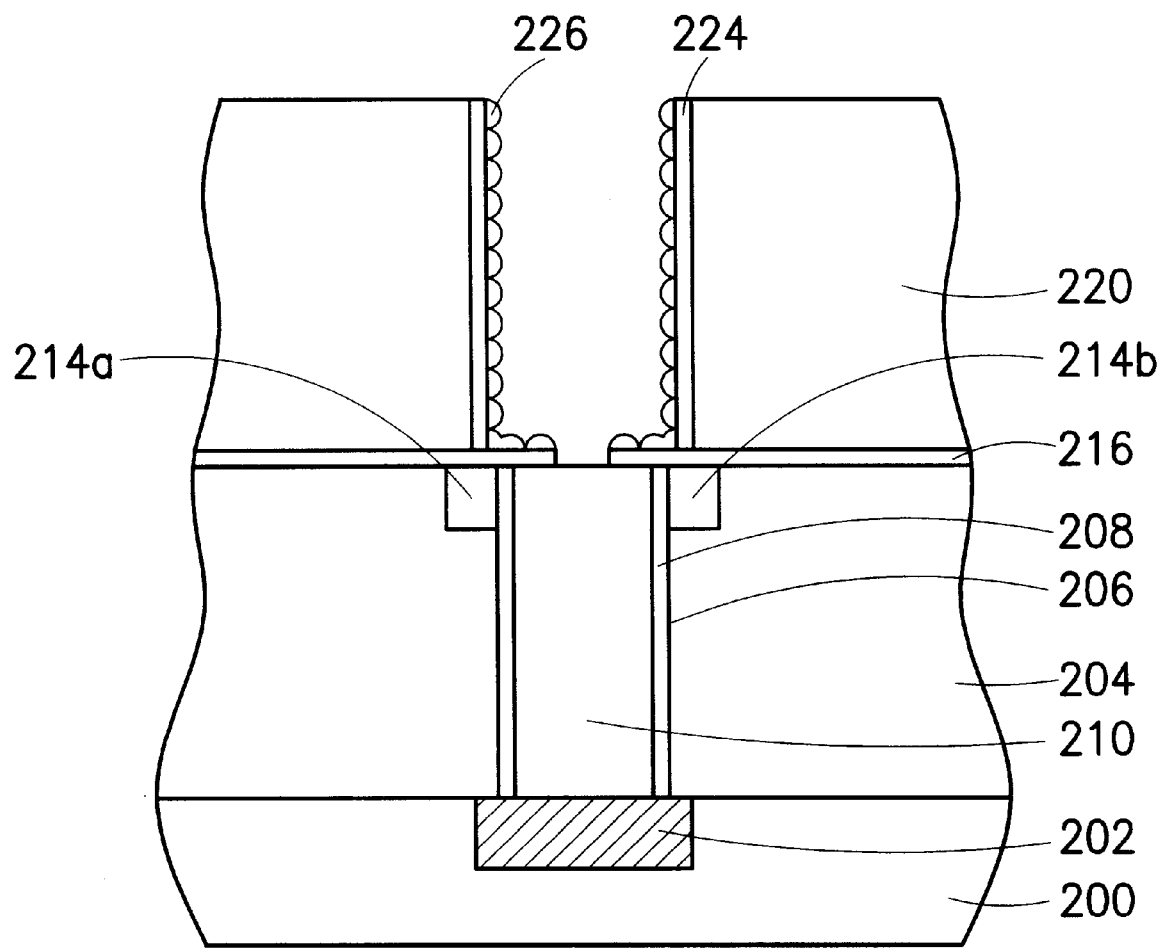

Reference is made to FIG. 2E, which shows a formation of a bottom electrode. A conformal conductive layer 224 is formed in the opening 222. The thickness of the conformal conductive layer 224 is about 300 angstroms to about 500 angstroms. In order to further increase the surface area of the bottom electrode, a hemispherical-grained silicon (HSG) layer 226 is preferably formed on the conformal conductive layer 224.

The present invention increases the integration of the semiconductor circuit by forming the bit lines 214a and 214b and the bottom electrode next to each other. Thus, the integration of the semiconductor devices is effectively increased. In addition, since the liner layers 208 and 216 are used to isolate the bit lines 214a and 214b from the bottom electrode, the reliability of the devices is enhanced. Moreover, because of the liner layers 208 and 216 provide isolation between the bottom electrode and the bit lines 214a and 214b, the opening 222 for forming the bottom electrode overlaps with the bit lines 214a and 214b when viewed from the top. Thus, the opening size can be increased according to the design requirement. The surface area of the bottom electrode thus is further increased.

It will be apparent to those skilled in the art that various modifications and variations can be made to the structure and the method of the present invention without departing from the scope or spirit of the invention. In view of the foregoing, it is intended that the present invention cover modifications and variations of this invention provided they fall within the scope of the following claims and their equivalents.

What is claimed is:

1. A method of fabricating a bottom electrode, comprising:

providing a substrate having a conductive layer therein;

forming a first dielectric layer having a first opening over the substrate, wherein the first opening exposes a portion of the conductive layer;

forming a first liner layer on a sidewall of the first opening;

forming a conductive plug in the opening;

patterning the first dielectric layer to form bit line openings next to the first opening, wherein the bit line openings expose the first liner layer;

filling a metal material in the bit line openings to form a plurality of bit lines;

forming a second liner layer over the substrate to cover the bit lines, the first liner layer, and the conductive plug;

patterning the second liner layer to form a node contact opening exposing a portion of the conductive plug;

forming a second dielectric layer over the substrate;

patterning the second dielectric layer to form a second opening, exposing the node contact opening and a portion of the second liner layer; and forming a conformal conductive layer in the opening.

2. The method of claim 1, wherein forming the first dielectric layer comprises forming an oxide layer.

3. The method of claim 1, wherein forming the first liner layer comprises forming a silicon nitride layer.

4. The method of claim 1, wherein forming the first liner layer comprises performing a plasma-enhanced chemical vapor deposition.

5. The method of claim 1, wherein forming the first liner layer comprises performing a deposition in a furnace.

6. The method of claim 1, wherein the first liner layer has a thickness of about 100 angstroms to about 500 angstroms.

7. The method of claim 1, wherein patterning the first dielectric layer to form bit line openings comprises performing a photolithographic and etching process using the first liner layer as an etching stop.

8. The method of claim 1, wherein filling a metal material in the bit line openings comprises filling tungsten in the bit line openings.

9. The method of claim 1, wherein forming the second liner layer comprises forming a silicon nitride layer.

10. The method of claim 1, wherein forming the second liner layer comprises performing a plasma-enhanced chemical vapor deposition.

11. The method of claim 1, wherein forming the second liner layer comprises performing a deposition in a furnace.

12. The method of claim 1, wherein the second liner layer has a thickness of about 100 angstroms to about 500 angstroms.

13. The method of claim 1, wherein forming the second dielectric layer comprises forming an oxide layer by chemical vapor deposition.

14. The method of claim 1, wherein patterning the second dielectric layer to form a second opening comprises performing a photolithographic and etching process using the second liner layer as an etching stop.

15. The method of claim 1, further comprising forming a hemispherical-grained silicon layer after forming a conformal conductive layer in the opening.

16. A method of fabricating a bottom electrode, comprising:

forming a first dielectric layer having a first opening over a substrate;

forming a first liner layer on a sidewall of the first opening;

forming a conductive plug in the opening;

forming a plurality of bit lines next to the first opening, wherein the bit line openings expose the first liner layer;

forming a second liner layer having a node contact opening over the substrate to cover the bit lines, the first liner layer, and the conductive plug, wherein the node contact opening exposes the conductive plug;

forming a second dielectric layer over the substrate;

patterning the second dielectric layer to form a second opening, exposing the node contact opening and a portion of the second liner layer; and forming a conductive layer in the opening.

17. The method of claim 16, wherein forming the first liner layer comprises forming a silicon nitride layer by deposition.

18. The method of claim 16, wherein the first liner layer has a thickness of about 100 angstroms to about 500 angstroms.

19. The method of claim 16, wherein forming the second liner layer comprises forming a silicon nitride layer by deposition.

20. The method of claim 16, wherein the second liner layer has a thickness of about 100 angstroms to about 500 angstroms.

* * * * *